United States Patent

Kitahara et al.

[11] Patent Number: 6,046,631
[45] Date of Patent: Apr. 4, 2000

[54] DETECTOR COUPLED TO TRANSMISSION LINE BY MICROSTRIP LINE

[75] Inventors: Takaya Kitahara, Tokyo; Kazuhisa Matsuge, Yokohama, both of Japan

[73] Assignee: Kabushiki Kaisha Toshiba, Kawasaki, Japan

[21] Appl. No.: 09/168,562

[22] Filed: Oct. 9, 1998

[30] Foreign Application Priority Data

Oct. 17, 1997 [JP] Japan ..................................... 9-285268

[51] Int. Cl.⁷ ................................ H01P 1/00; H03D 1/10
[52] U.S. Cl. ........................... 329/354; 324/95; 324/119; 327/104; 329/370; 333/247
[58] Field of Search .................... 329/354, 370; 324/95, 119; 363/126; 333/247; 327/61, 104

[56] References Cited

U.S. PATENT DOCUMENTS 4,360,865 11/1982 Yasumura et al. ..................... 363/126

FOREIGN PATENT DOCUMENTS

| 5-63470 | 3/1993 | Japan . |
| 7-202501 | 8/1995 | Japan . |
| 8-78901 | 3/1996 | Japan . |
| 2 128 827 | 5/1984 | United Kingdom . |

Primary Examiner—Siegfried H. Grimm
Attorney, Agent, or Firm—Oblon, Spivak, McClelland, Maier & Neustadt, P.C.

[57] ABSTRACT

The present invention provides a detector comprising a microstrip line having one end being grounded and another end connected to a main transmission line, a detection diode connected to the microstrip line, and a smoothing circuit for smoothing a signal detected by the detection diode.

11 Claims, 2 Drawing Sheets

DETECTOR COUPLED TO TRANSMISSION LINE BY MICROSTRIP LINE

BACKGROUND OF THE INVENTION

The present invention relates to a detector and especially relates to a detector being used for a microwave band power amplifier etc.

A conventional detector will be explained with reference to FIG. 1. In FIG. 1, a reference numeral 1 denotes a main transmission line and resistances R2 and R3 are connected to the main transmission line 1. And then, a part of the microwave power that propagates on the main transmission line 1 is divided by resistances R2 and R3. The divided microwave power is converted to a voltage by a detection diode CR4, and then direct current voltage is obtained by a smoothing capacitor C5.

The elements R2, R3, CR4 and C5 constituting the detector are closely connected with each other and the detector including the elements R2, R3, CR4 and C5 has good characteristics like (1) to (3) as following since the elements R2, R3, CR4 and C5 are closely connected to the main transmission line 1.

(1) The frequency response of the detection voltage has good characteristics.

(2) The precision of the detection voltage that is decided by the partial voltage by the resistances R2 and R3 is improved.

(3) The whole circuit becomes a small size.

As described above, the detector has good characteristics. However, the characteristics of the detection diode CR4 are adversely affected by coupling to the main transmission line 1, that is, a capacity between the main transmission line 1 and detection diode CR4 becomes large since the elements R2, R3, CR4 and C5 are closely provided with the main transmission line 1.

By the way, the distance between the elements R2, R3, CR4, C5 and main transmission line 1 becomes about 2 to 3 mm since each of the elements R2, R3, CR4 and C5 is about 2 to 3 mm per side. Therefore, the characteristics of the detector are influenced by the coupling adversely affecting the characteristics thereof from main transmission line 1 in such a distance.

The conventional detector that decreases the influence of the power radiation will be explained with reference to FIG. 2.

As shown in FIG. 2, the microstrip line 7 that has the length of a ¼ wavelength of a propagation signal is formed in parallel with a main transmission line 6. One end 7a of the microstrip line 7 is grounded via a resistance R8 and another end thereof is connected to the detection diode CR9. The detection voltage is obtained by the detection diode CR9, and then, a direct voltage is obtained by the smoothing capacitor C10.

In the case of such a detector, an output power is detected by the spatial coupling between the main transmission line 6 and microstrip line 7.

In the detector, it can make the another end 7b of microstrip line 7 long and make the main transmission line 6 separate from the detection diode CR9. Therefore, the influence of the detection diode CR9 in characteristics can be prevented.

However, there is a problem that the main transmission line 6 requires a ¼ wavelength in parallel with the microstrip line 7 to obtain a degree of spatial coupling between the main transmission line 6 and microstrip line 7 in such the detector. Furthermore, there is a problem that the dispersion occurs in the detection voltage because of variations in the coupling characteristic between the main transmission line 6 and microstrip line 7.

In the conventional detector as shown in FIG. 1, the detector can be made a small size since the constitution elements are closely connected to the main transmission line 6.

However, on the other hand, there is a problem that the characteristic degrades by the coupling adversely affecting the characteristics of the detector.

In the conventional detector shown in FIG. 2, the main transmission line 6 is formed in parallel with the micro strip line. Therefore, the degradation of characteristics by the coupling adversely affecting the characteristics of the detector from the main transmission line decreases. Furthermore, there is a problems that the dispersion occurs in detection voltage by the dispersion of coupling characteristics and that the regular length becomes necessary to a main transmission line.

BRIEF SUMMARY OF THE INVENTION

The present invention has been made in consideration of the above situation and has as its object to provide a detector with good characteristics and a small size.

In order to achieve the above object, according to the first aspect of the present invention, there is provided a detector comprising:

a microstrip line having one end being grounded and another end connected to a main transmission line;

a detection diode, connected to the microstrip line, for detecting a signal which propagates on the microstrip line; and a smoothing circuit for smoothing the signal detected by the detection diode.

According to the second aspect of the present invention, there is provided a detector comprising:

a microstrip line having one end which is grounded and another end connected to a main transmission line being connected to an amplifier, the microstrip line which is for matching with an output impedance of the amplifier and a characteristic impedance of the main transmission line;

a detection diode, connected to the microstrip line, for detecting a signal which propagates on the microstrip line; and a smoothing circuit for smoothing the signal detected by the detection diode.

According to the third aspect of the present invention, there is provided a detector comprising:

a harmonics filter line having one end which is grounded and another end connected to a main transmission line being connected to an amplifier;

a detection diode, connected to the harmonics filter line, for detecting a signal which propagates on the harmonics filter line; and a smoothing circuit for smoothing the signal detected by the detection diode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described below with reference to the accompanying drawings.

<First Embodiment>

Figure 1:
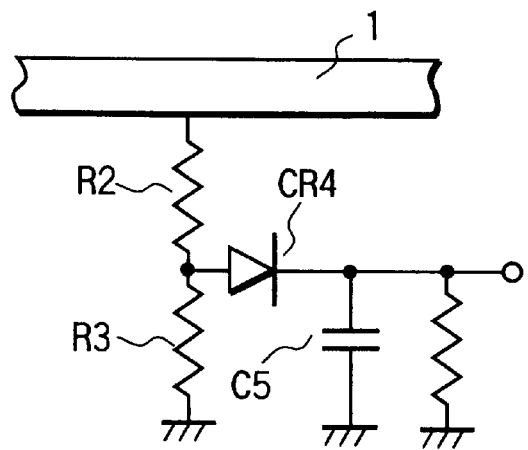
FIG. 1 is a view showing a conventional detector.
Figure 2:
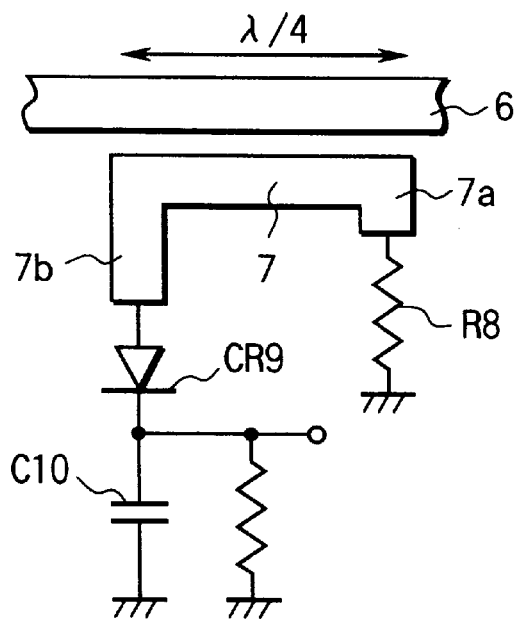
FIG. 2 is a view showing a conventional detector.
Figure 3:
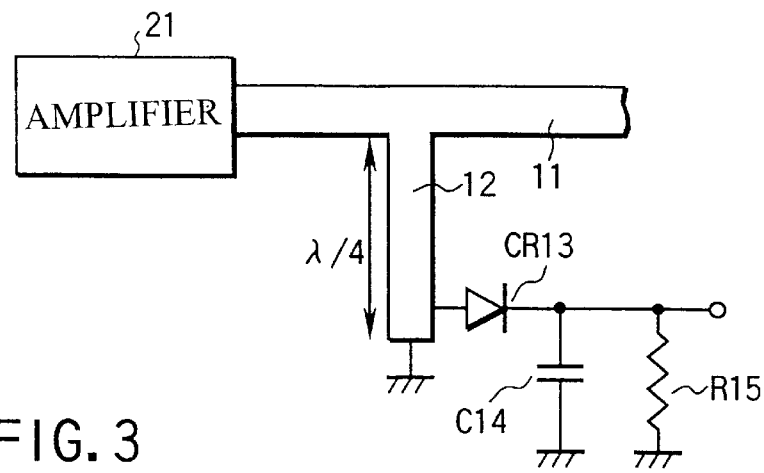
FIG. 3 is a view showing a detector according to the first embodiment of the present invention.

FIG. 3 shows a detector according to the first embodiment of the present invention.

This detector is the detector that is used for a microwave band power amplifier etc.

In FIG. 3, a reference numeral 11 denotes a main transmission line, and a microstrip line 12, connected to the main transmission line 11, has the length of a ¼ wavelength of the electromagnetic wave which propagates the main transmission line 11. Furthermore, another end of the micro strip line 12 is grounded. Then, a detection diode CR13 is connected to the microstrip line 12 close to the grounded point thereof. The smoothing capacitor C14 and resistance R15 are connected to an output side of the detection diode CR13.

It is to be noted that a position of connection point between the microstrip line 12 and detection diode CR13 is determined based on the output power of a power amplifier, a frequency of the electromagnetic wave which propagates the main transmission line 11, characteristics of the detection diode CR13 and a detection voltage which is desired.

Also, an amplifier 21 is connected to the main transmission line 11.

These devices CR13, C14 and R15 can be separated from the main transmission line 11 since the devices CR13, C14 and R15 are provided in close to the grounded point of the microstrip line 12. Therefore, the influence of the coupling adversely affecting the characteristics of the detector from main transmission line 11 decreases and characteristics of deterioration in the detector can be reduced.

Furthermore, if the constitution elements of the microwave band power amplifier are about a few mm per side respectively and a ¼ wavelength of the electromagnetic wave is about 10 mm or more, the constitution elements can keep distance about a ¼ wavelength from the main transmission line 11. Thus, the influence of the coupling adversely affecting the characteristics of the detector can be decreased.

Also, the length of main transmission line 11 can be shortened since the microstrip line 12 is drawn directly from main transmission line 11. Therefore, the dispersion of the detection voltage caused by the dispersion of the coupling characteristic in the transmission line does not occur.

The length of main transmission line 11 is the factor that influences the characteristic of a power amplifier circuit. If the length is short, the characteristic of the power amplifier circuit is improved and loss in the power amplifier circuit is less. Therefore, according to the first embodiment, it is a large effect that the length of the main transmission line 11 can be short.

Furthermore, a detector can be realized that is not influenced by the characteristic of the electromagnetic wave that propagates main transmission line 11 since the micro strip line 12 has the length of a ¼ wavelength of the electromagnetic wave which propagates main transmission line 11.

<Second Embodiment>

Figure 4:
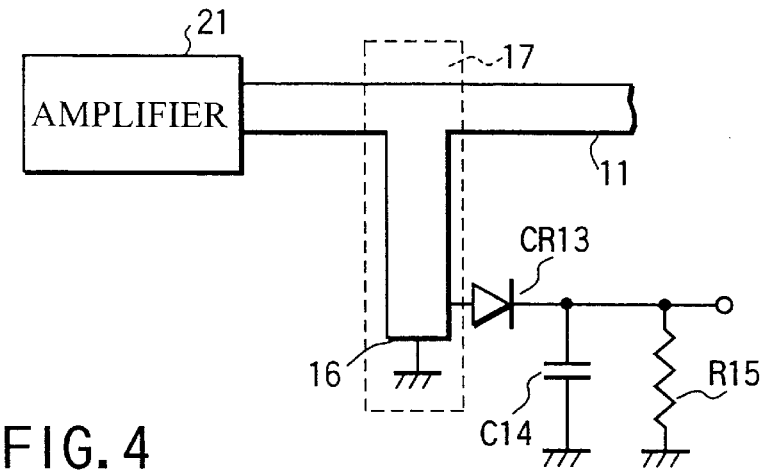
FIG. 4 is a view showing a detector according to the second embodiment of the present invention.

FIG. 4 is a view showing a detector according to the second embodiment of the present invention.

The same elements shown in FIG. 3 are given the same reference numerals, and explanation of the same reference numerals is omitted.

In FIG. 4, a reference numeral 16 denotes a micro strip line having one end connected to the main transmission line 11 and another end which is grounded. This microstrip line 16 acts as a matching circuit 17.

Specifically, a width and length of the matching circuit 17 are set so as to match the output impedance of amplifier 21 and characteristic impedance of the main transmission line 11.

The detection diode CR13 is connected to a point close to a grounded point of the microstrip line 16 and the smoothing capacitor C14 and resistance R15 are connected to the detection diode CR13.

Also, according to the detector of this embodiment, the detection diode CR13, smoothing capacitor C14 and resistance R15 are provided in a dead space of the matching circuit 17.

Accordingly, according to the detector of this embodiment, it can decrease the influence of the coupling adversely affecting the characteristics of the detector from the main transmission line 11 and shorten the length of transmission line and prevent a dispersion in detection voltage. Also, it can save space since the dead space is useable effectively.

<Third Embodiment>

Figure 5:
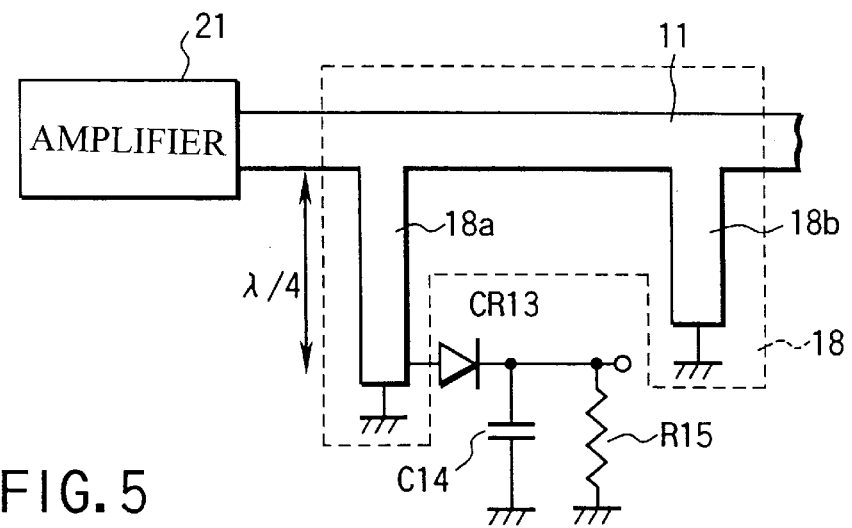
FIG. 5 is a view showing a detector according to the third embodiment of the present invention.

FIG. 5 is a view showing a detector according to the third embodiment of the present invention.

In FIG. 5, reference numerals 18a and 18b denote a harmonics filter line, respectively. The same elements as shown in FIG. 3 are given the same reference numerals, and explanation of the same reference numerals is omitted.

As shown in FIG. 5, one end of each harmonics filter line 18a and 18b is connected to the main transmission line 11. Another end of each harmonics filter line 18a and 18b is grounded.

The harmonics filter 18 is formed by the main transmission line 11 and harmonics filter lines 18a, 18b. The detection diode CR13 is connected to the harmonics filter line 18a close to a grounded point of the harmonics line 18a, and the smoothing capacitor C14 and resistance R15 are connected to the detection diode CR13.

According to the present embodiment, it can provide a detector circuit using a harmonics filter without receiving the influence of the coupling adversely affecting the characteristics from a main transmission line.

A characteristic of a signal which propagates on the main transmission line 11 is not influenced in a case where the harmonics filter line 18a has a length of a ¼ wavelength of the signal.

Therefore, according to the present invention, it can provide a detector having little dispersion in detection voltage and good characteristics and which is a compact without receiving the influence of the coupling adversely affecting the characteristics of the detector from a main transmission line.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A detector comprising:
   a microstrip line having one end being grounded and another end connected to a main transmission line;
   a detection diode, connected to the microstrip line, for detecting a signal which propagates on the microstrip line; and
   a smoothing circuit for smoothing the signal detected by the detection diode.

2. A detector according to claim 1,
   wherein the detection diode is connected to the microstrip line close to the one end thereof.

3. A detector according to claim 1,
   wherein the smoothing circuit comprises a capacitor and resistance connected in parallel with an output terminal of the detection diode.

4. A detector according to claim 1,
   wherein the microstrip line has a length of ¼ wavelength of a signal which flows on the main transmission line.

5. A detector comprising:
   a microstrip line having one end which is grounded and another end connected to a main transmission line being connected to an amplifier, the microstrip line which is for matching with an output impedance of the amplifier and a characteristic impedance of the main transmission line;
   a detection diode, connected to the microstrip line, for detecting a signal which propagates on the microstrip line; and
   a smoothing circuit for smoothing the signal detected by the detection diode.

6. A detector according to claim 5,
   wherein the detection diode is connected to the microstrip line close to the one thereof.

7. A detector according to claim 5,
   wherein the smoothing circuit comprises a capacitor and resistance connected in parallel with an output terminal of the detection diode.

8. A detector comprising:
   a harmonics filter line having one end which is grounded and another end connected to a main transmission line being connected to an amplifier;
   a detection diode, connected to the harmonics filter line, for detecting a signal which propagates on the harmonics filter line; and
   a smoothing circuit for smoothing the signal detected by the detection diode.

9. A detector according to claim 8,
   wherein the detection diode is connected to the harmonics filter line close to the one end thereof.

10. A detector according to claim 8,
    wherein the smoothing circuit comprises a capacitor and resistance connected in parallel with an output terminal of the detection diode.

11. A detector according to claim 8,
    wherein the harmonics filter line has a length of ¼ wavelength of a signal which flows on the main transmission line.

* * * * *